(12) United States Patent
Capofreddi et al.

(10) Patent No.: US 7,164,313 B2
(45) Date of Patent: Jan. 16, 2007

(54) METHOD AND APPARATUS FOR OPENING A FEEDBACK LOOP

(75) Inventors: Peter Capofreddi, San Francisco, CA (US); Derek K. Shaeffer, Redwood City, CA (US); Sriraman Dakshinamurthy, San Jose, CA (US); Korhan Titizer, Saratoga, CA (US)

(73) Assignee: Aspendos Communications, San Jose, CA (US)

( * ) Notice: Subject to any disclaimer, the term of this patent is extended or adjusted under 35 U.S.C. 154(b) by 99 days.

(21) Appl. No.: 10/988,432

(22) Filed: Nov. 12, 2004

(65) Prior Publication Data

US 2006/0103462 A1 May 18, 2006

(51) Int. Cl.
*H03F 1/36* (2006.01)

(52) U.S. Cl. .......................... 330/86; 330/85; 330/136

(58) Field of Classification Search ................ 330/103, 330/85–86, 136; 445/126
See application file for complete search history.

(56) References Cited

U.S. PATENT DOCUMENTS 5,469,105 A * 11/1995 Sparks ....................... 330/129
5,933,767 A * 8/1999 Leizerovich et al. ........ 455/126

OTHER PUBLICATIONS

Dawson et al., "Automatic Phase Alignment for a Fully Integrated Cartesian Feedback Power Amplifier System", IEEE Journal of Solid-State Circuits, Dec. 2003, 38(12):2269-2279.
Faulkner et al., "Performance of automatic phase adjustment using supply current minimization in a RF feedback lineariser," in Proc. 8th IEEE Int. Symp. Personal, Indoor, and Mobile Radio Communications, 1997, pp. 858-862.
Ohishi et al., "Cartesian Feedback Amplifier with Soft Landing," in Proc. 3rd IEEE Int. Symp. Personal, Indoor, and Wireless Communications, 1992, pp. 402-406.
Sornin et al., "A robust Cartesian feedback loop for a 802.11 a/b/g CMOS transmitter", 2004. IEEE Radio Frequency Integrated Circuits (RFIC) Symposium, Fort Worth, TX, Jun. 6-8, 2004, pp. 145-148.

* cited by examiner

*Primary Examiner*—Robert Pascal
*Assistant Examiner*—Hieu Nguyen
(74) *Attorney, Agent, or Firm*—Fish & Richardson P.C.

(57) ABSTRACT

Circuits, methods, and systems are provided for opening a primary feedback loop in a transmitter. An auxiliary feedback loop can be closed when the primary feedback loop is opened, and a controller can match a gain of the primary feedback loop to another gain in the transmitter.

36 Claims, 5 Drawing Sheets

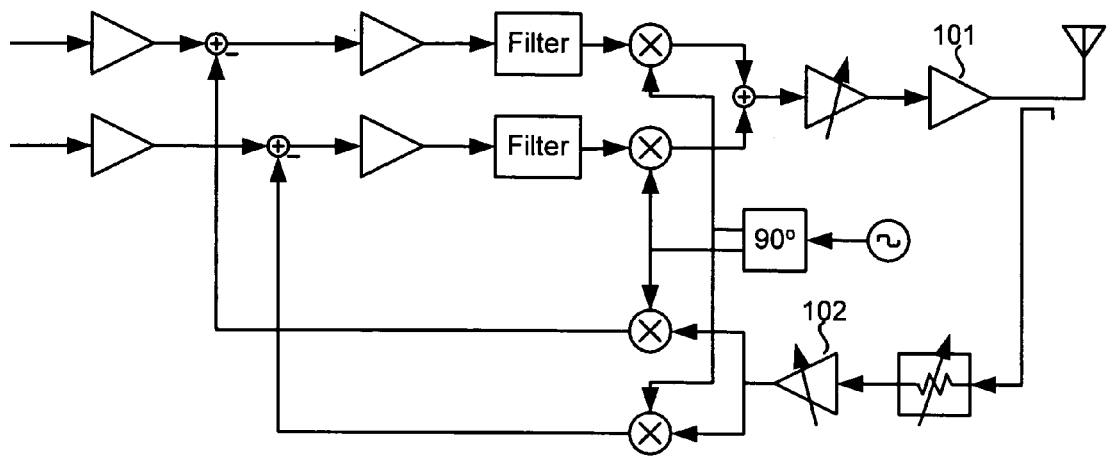
FIG._1
*(PRIOR ART)*
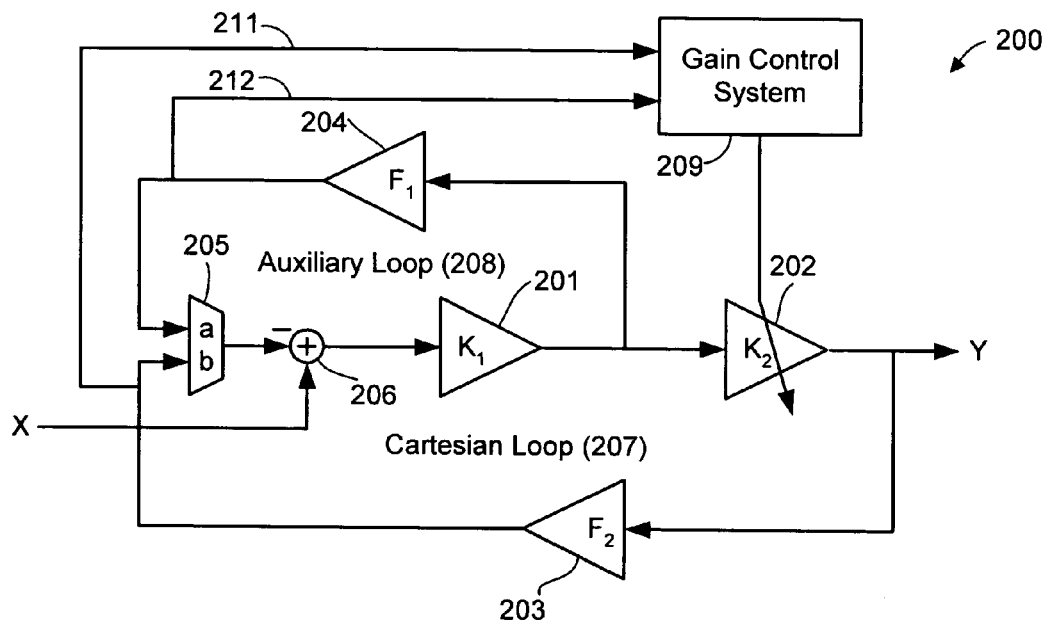
FIG._2A

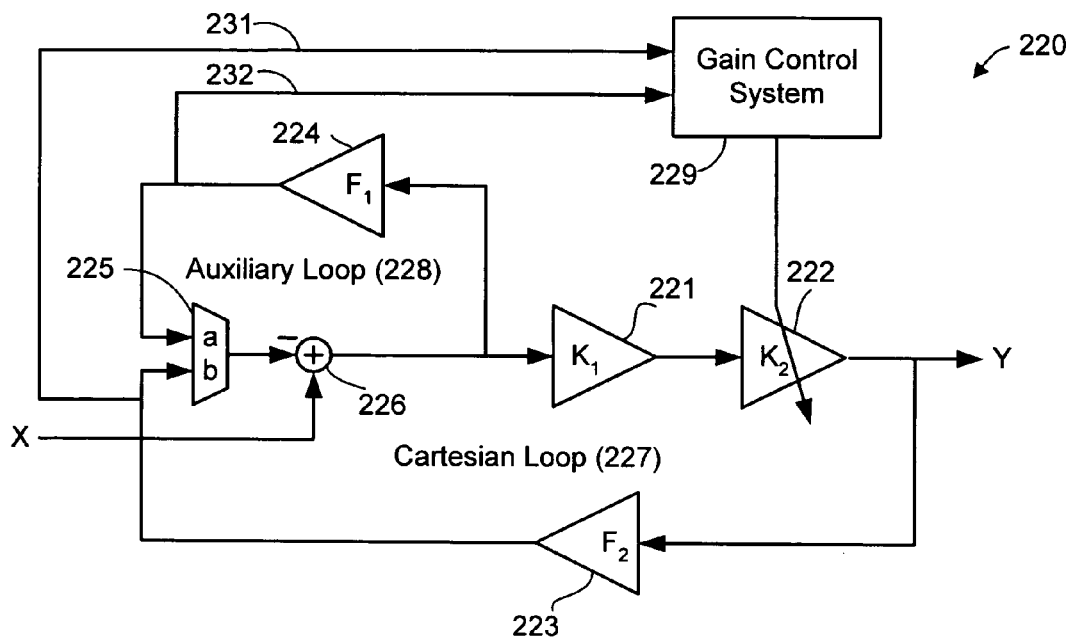
FIG._2B
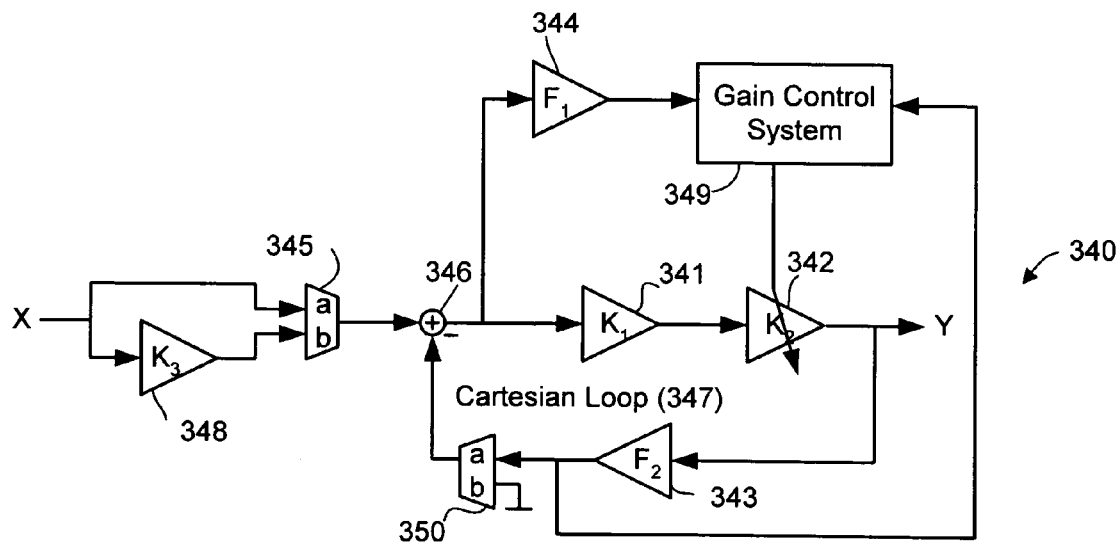
FIG._3

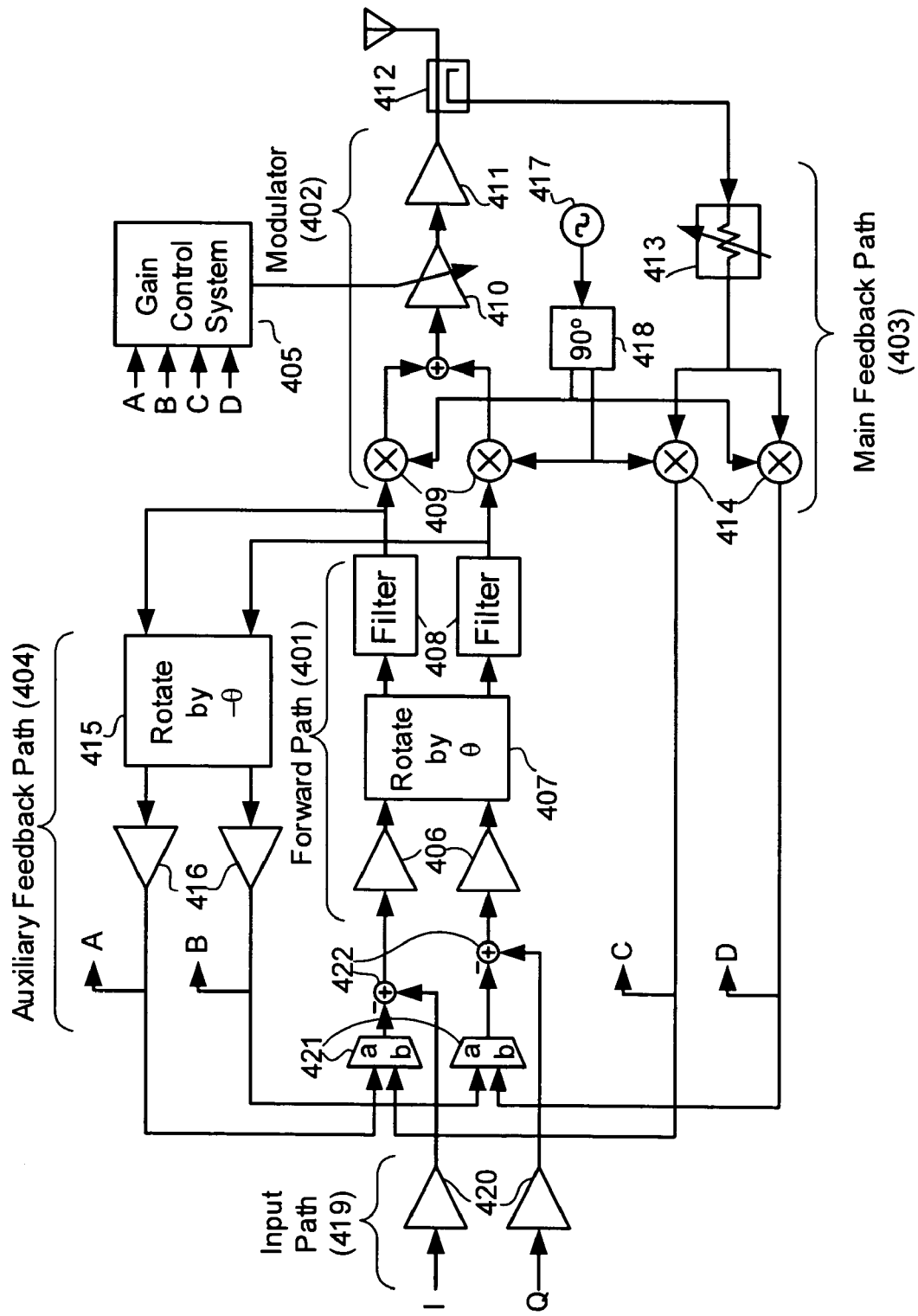
FIG._4

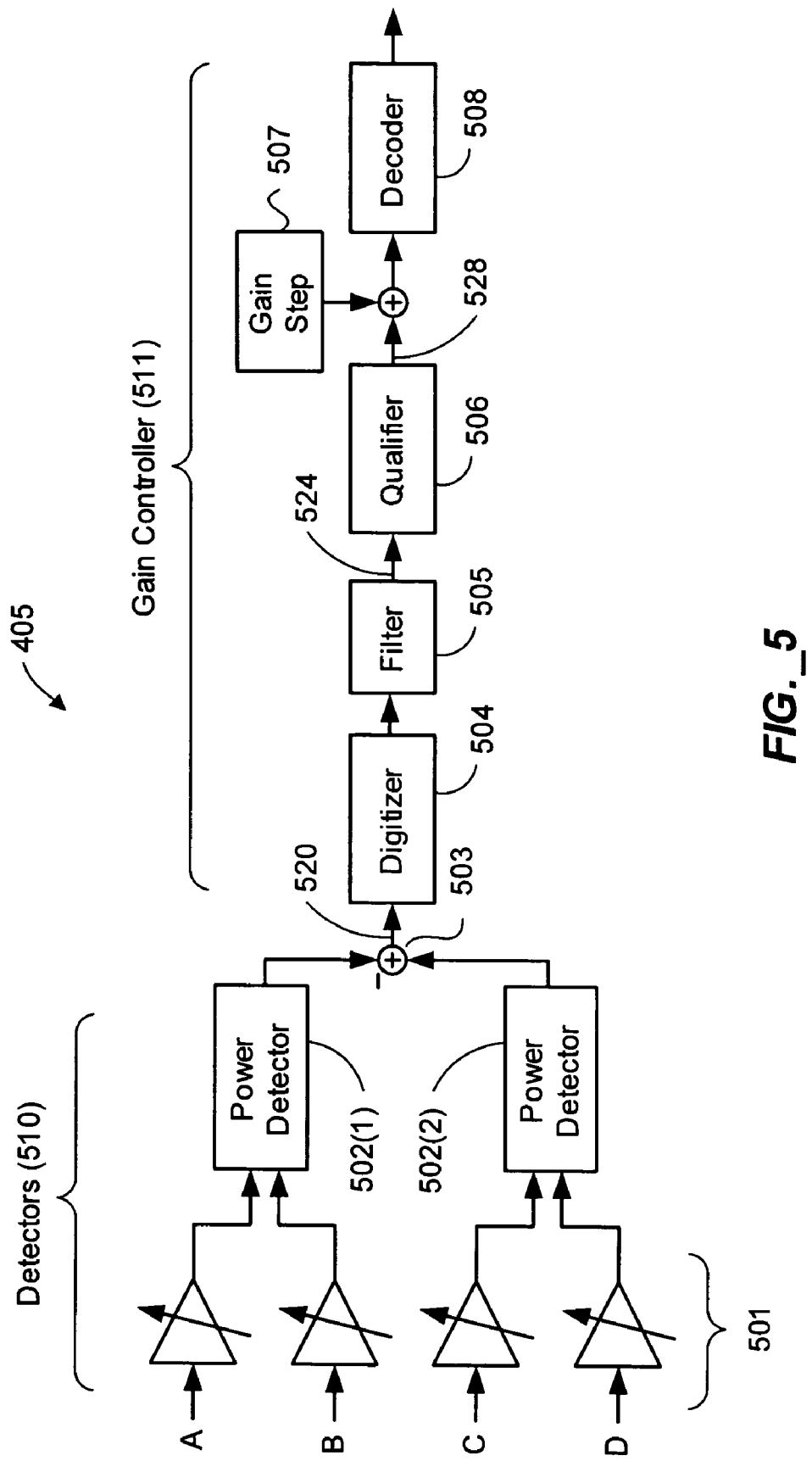
FIG._5

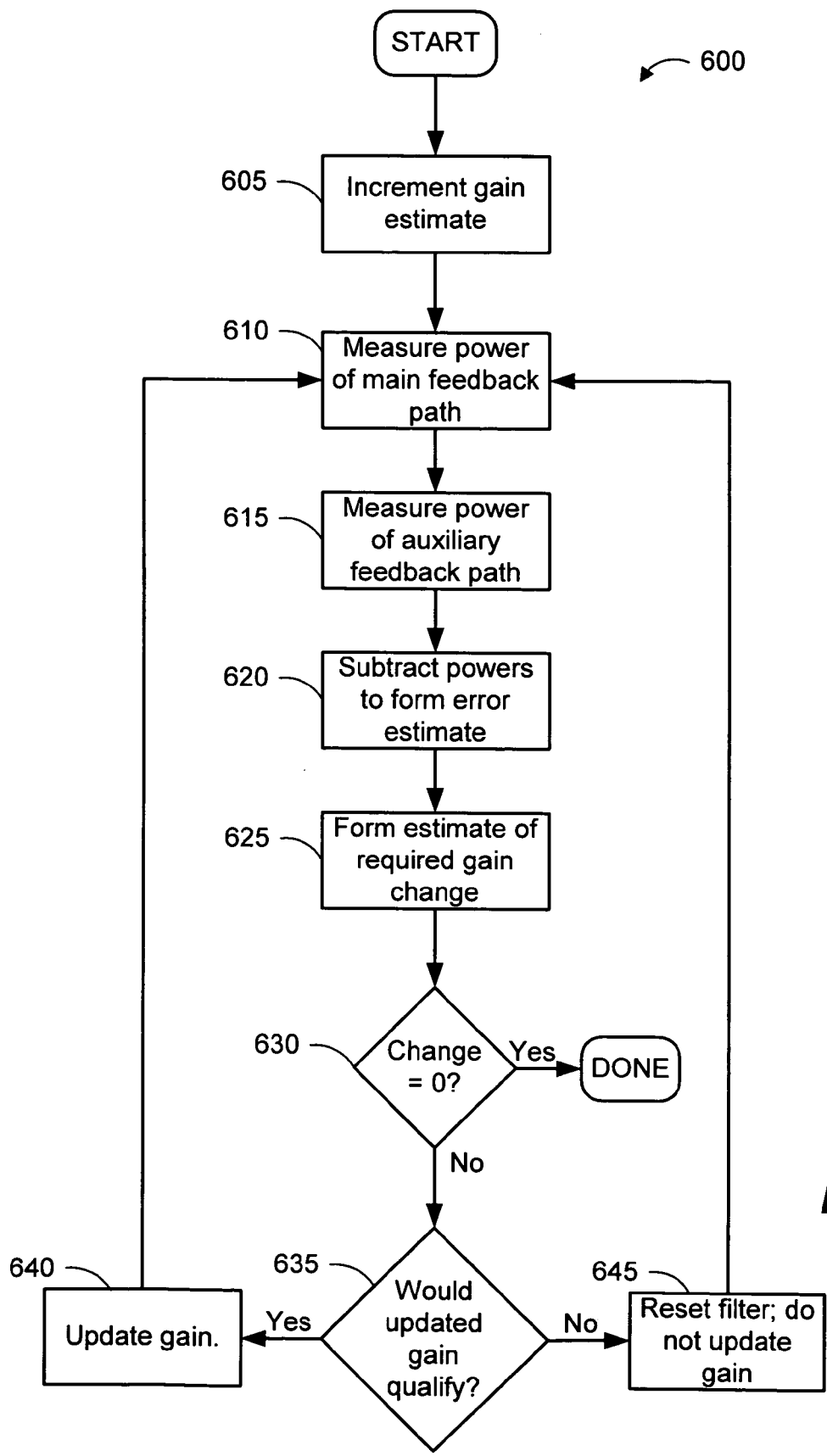
FIG._6

METHOD AND APPARATUS FOR OPENING A FEEDBACK LOOP

BACKGROUND

The following disclosure relates to electrical circuits and signal processing.

A Cartesian feedback loop can be used to improve the linearity of a radio transmitter. An example of a Cartesian feedback loop is shown in FIG. 1. The improvement in linearity allows the use of a less linear, more power efficient power amplifier 101 while maintaining the performance required by a given application.

At low output power levels, the signal in the feedback path can be amplified using an amplifier block 102 in order to improve noise and carrier leakage performance. The feedback amplifier block 102 contributes significantly to the power consumption of the system when the transmitter is operating at low output power levels.

SUMMARY

In one aspect, a circuit is provided that includes a signal combiner, which receives an input signal and a feedback signal and produces a combined signal at an output. The circuit also includes a selector that provides the feedback signal to the signal combiner, a power amplifier, where the output of the signal combiner is coupled to an input of the power amplifier, a first feedback path that couples an output of the power amplifier to a first input of the selector, and a second feedback path that couples the input of the power amplifier to a second input of the selector.

Particular implementations may include one or more of the following features. The circuit includes an adjustable amplifier, where an input of the adjustable amplifier is coupled to the output of the signal combiner, and an output of the adjustable amplifier is coupled to the input of the power amplifier. The circuit also includes a controller that is coupled to a node in the first feedback path and coupled to a node in the second feedback path, where the controller is operable to adjust a gain of the adjustable amplifier. The controller adjusts the gain of the adjustable amplifier until a gain of a loop including the first feedback path and a gain of a loop including the second feedback path are substantially equal.

The controller includes a qualifier that modifies the adjustment of the gain of the adjustable amplifier based on a set of rules limiting allowable adjustments. The controller includes a gain step element that adjusts the gain of the adjustable amplifier in conjunction with a change in an output power. The controller includes a first power detector that measures a power of the first feedback path and produces a first power signal, a second power detector that measures a power of the second feedback path and produces a second power signal, and a combiner that receives the first power signal and the second power signal and produces an error signal. The controller includes a filter that receives the error signal and produces a filtered signal, where the controller adjusts the gain of the adjustable amplifier using the filtered signal. The controller includes a first variable-gain amplifier that is coupled to an input of the first power detector and includes a second variable-gain amplifier that is coupled to an input of the second power detector.

The first power detector includes a first multiplier that calculates a mean-square value of the power of the first feedback path, and the second power detector includes a second multiplier that calculates a mean-square value of the power of the second feedback path. Alternatively, the first power detector includes a first rectifier that calculates an absolute value of the power of the first feedback path, and the second power detector includes a second rectifier that calculates an absolute value of the power of the second feedback path. The controller includes a digitizer that receives the error signal and produces a digital error signal.

The circuit includes an integrating gain amplifier that is coupled to the output of the signal combiner and that is coupled to the input of the power amplifier. The first feedback path includes in-phase and quadrature first feedback paths and the second feedback path includes in-phase and quadrature second feedback paths. The second feedback path includes a rotator. At least one of the first feedback path and the second feedback path includes a variable-gain element. A first amplifier is coupled to the input of the power amplifier, the first feedback path includes a second amplifier, and the second feedback path includes a third amplifier.

In another aspect, a circuit is provided that includes a forward path, which includes an adjustable amplifier. The circuit also includes a first selector that has at least two inputs and an output, and the output of the first selector is coupled to an input of the forward path. A feedback path couples an output of the forward path to an input of the first selector. A controller measures a signal at a node in the feedback path, measures a signal at a node in the forward path before the adjustable amplifier, and adjusts a gain of the adjustable amplifier responsive to the measurements.

Particular implementations may include one or more of the following features. The circuit includes a second selector that has at least two inputs and an output, where the output of the second selector is coupled to the input of the forward path. A first amplifier is coupled to a first input of the second selector, an input of the first amplifier is coupled to an input of the circuit, and a second input of the second selector is coupled to the input of the circuit. A controller amplifier couples the controller to the node in the forward path where the controller measures the signal, and the controller adjusts the gain of the adjustable amplifier until a gain of a loop including the feedback path and a gain of the controller amplifier are substantially equal. The controller includes a first power detector that measures a power of the feedback path and produces a first power signal, a second power detector that measures a power at an output of the controller amplifier and produce a second power signal, and a combiner that receives the first power signal and the second power signal and produces an error signal. The controller includes a filter that receives the error signal and produces a filtered signal, where the controller adjusts the gain of the adjustable amplifier using the filtered signal. The controller includes a first variable-gain amplifier that is coupled to an input of the first power detector and includes a second variable-gain amplifier that is coupled to an input of the second power detector.

The first power detector includes a first multiplier that calculates a mean-square value of the power of the feedback path, and the second power detector includes a second multiplier that calculates a mean-square value of the power at the output of the controller amplifier. Alternatively, the first power detector includes a first rectifier that calculates an absolute value of the power of the feedback path and the second power detector includes a second rectifier that calculates an absolute value of the power at the output of the controller amplifier. The controller includes a digitizer that receives the error signal and produces a digital error signal.

The controller includes a qualifier that modifies the adjustment of the gain of the adjustable amplifier based on a set of rules limiting allowable adjustments. The controller includes a gain step element that adjusts the gain of the adjustable amplifier in conjunction with a change in an output power. The forward path includes a second amplifier and a power amplifier, the feedback path includes a third amplifier, and the outputs of the first and second selectors are coupled to the input of the forward path through a signal combiner.

In another aspect, a method is provided that measures a first power of a first feedback path associated with a transmitter, measures a second power of a second feedback path associated with the transmitter, calculates a difference between the first power and the second power, and adjusts a gain of an amplifier associated with the transmitter responsive to the difference until the first power and the second power are substantially equal.

Particular implementations may include one or more of the following features. The first feedback path is decoupled from an input of a forward path, and the second feedback path is coupled to the input of the forward path, where the decoupling and the coupling occur substantially simultaneously. The first feedback path is decoupled when a power of the transmitter falls below a threshold. The difference between the first power and the second power is filtered to form a gain estimate, and adjusting the gain responsive to the difference includes using the gain estimate to adjust the gain. A change in the gain estimate is disqualified to limit a change in an output power. The filtering of the difference is restarted when the change in the gain estimate is disqualified, where the restarting of the filtering serves to reset the gain estimate. A step is applied to the gain responsive to a change in a gain of the first feedback path, the second feedback path, or both.

These general and specific aspects may be implemented using an apparatus, a method, a system, or any combination of apparatus, methods, and systems.

The invention can be implemented to realize one or more of the following advantages. Consistency between an open-loop operating mode and a closed-loop operating mode of a transmitter is maintained. Consistency is maintained even if the gains of amplifiers in the loops are not known with accuracy or are subject to manufacturing, temperature, or voltage variations. A loop gain of a main feedback loop is regulated to match a loop gain of an auxiliary loop whose loop gain can be controlled precisely. Accurate gain steps are provided when transitioning between the closed- and open-loop operating modes. A constant loop transmission is maintained in closed-loop mode to preserve stability margins (e.g., phase and gain margins) of the loop, and spurious oscillations are prevented. The system loop transmission is maintained in a state of readiness so that oscillations are avoided when operating in, or transitioning into, a closed-loop operating mode. Saturation of an integrator in a forward path is avoided. Power consumption is reduced, especially at low output powers.

The details of one or more implementations are set forth in the accompanying drawings and the description below. Other features and advantages will become apparent from the description, the drawings, and the claims.

BRIEF DESCRIPTION OF THE DRAWINGS

FIG. 1 shows a prior-art implementation of a Cartesian feedback loop transmitter.

FIGS. 2A–2B are block diagrams of transmitters using an auxiliary feedback loop and a gain control system.

FIG. 3 is a block diagram of a transmitter using a gain control system.

FIG. 4 shows an implementation of a Cartesian feedback transmitter.

FIG. 5 shows a gain control system.

FIG. 6 is a flowchart of a gain control method.

Like reference numbers and designations in the various drawings indicate like elements.

DETAILED DESCRIPTION

Cartesian feedback is useful for correcting nonlinearities in a power amplifier, such as a power amplifier included in a wireless transmitter. The nonlinearity mechanisms in the power amplifier are most significant at high power levels. For a given application, there is a power level below which the nonlinearity has reduced sufficiently that Cartesian feedback is no longer needed. When operating at a power level where Cartesian feedback is not needed, the transmitter can be reconfigured into an open-loop mode. In open-loop mode, the transmitter becomes similar to a conventional transmitter, and the noise and carrier leakage performance can also be made similar that of a conventional transmitter. The reconfiguration into open-loop mode is enabled by adding an auxiliary feedback loop and/or gain controller to the transmitter, as described below.

At low power levels, a feedback amplifier typically would be activated if the Cartesian feedback loop were to remain closed. If the transmitter is reconfigured to an open-loop mode, however, the feedback amplifier is no longer needed. Adding an auxiliary feedback loop and/or gain controller to the transmitter allows the transmitter to be reconfigured into an open loop mode before the feedback amplifier is needed and makes operation without a feedback amplifier possible.

In a typical cellular phone application, the output power level of the transmitter may be changed at any time due to changing data rate requirements, changes in the distance between the handset and base station, and variations in the radio channel quality due to atmospheric conditions, other transmitters, and interference. When opening and closing a Cartesian feedback loop, the output power level may change from the region where the Cartesian feedback loop is closed to the region where the Cartesian feedback loop is open, or vice versa, at any time. The reconfiguration of the transmitter from closed-loop mode to open-loop mode, and vice versa, can be done in such a way that the transmitter meets performance requirements immediately after the change. To do so, the transmitter can be maintained in a state of readiness to change configuration at all times. In particular, the gain of the loop can be maintained at a constant level so that the effect of opening and closing the loop can be predicted.

In some wireless systems, a transmitter is expected to provide consistent output power steps in response to a power change command. When opening and closing a feedback loop in a transmitter, providing accurate gain steps when transitioning between closed- and open-loop operating modes is beneficial. Maintaining a constant loop transmission in closed-loop mode helps to preserve stability margins (e.g., phase and gain margins) of the loop to prevent spurious oscillations. A technique to maintain the system loop transmission in a state of readiness is useful so that oscillations are avoided when operating in, or transitioning into, a closed-loop operating mode.

A system for regulating the gains in a Cartesian feedback loop transmitter to provide accurate output power control in open- and closed-loop operating modes across a wide range of output power levels is illustrated in FIG. 2A. A system 200 is a simplified feedback system with two feedback loops and two modes of operation. The loop containing amplifiers 201, 202, and 203 represents a conventional Cartesian feedback loop 207. Amplifier 202 includes a power amplifier and the RF modulator section of the Cartesian feedback loop 207. Amplifier 203 includes an RF demodulator section of the Cartesian feedback loop 207. The details of the modulator and demodulator are omitted from the diagram, as they are not required for illustrating the principle of the technique. A second loop contains amplifiers 201 and 204 and represents an auxiliary feedback loop 208. A selector 205 selects which feedback loop is active. The input signal is applied to a summing junction 206. By setting the selector 205 so that input 'b' is active, the feedback path for the Cartesian feedback loop 207, which includes amplifier 203, is connected to summing junction 206, and system 200 is in a closed-loop mode of operation. Alternatively, by setting the selector 205 so that input 'a' is active, the feedback path for the auxiliary feedback loop 208, which includes amplifier 204, is connected to summing junction 206, and system 200 is in an open-loop mode of operation because the Cartesian feedback loop 207 is opened. System 200 has the same total gain from the input, X, to the output, Y, in both the open- and closed-loop modes of operation, provided that the product of the gains of amplifiers 202 and 203 is equal to the gain of amplifier 204. If the gain of amplifier 202 is represented by $K_2$, the gain of amplifier 204 is represented by $F_1$, and the gain of amplifier 203 is represented by $F_2$, the equality can be expressed mathematically as $F_1 = K_2 F_2$.

When the equality is satisfied, the gain of system 200 is the same in both the open-and closed-loop modes of operation. Furthermore, the loop gains of auxiliary feedback loop 208 and Cartesian feedback loop 207 will be the same. That is, $K_1 F_1 = K_1 K_2 F_2$.

The loop gains of auxiliary feedback loop 208 and Cartesian feedback loop 207 can be made equal by actively adjusting at least one of the loop gains in response to a comparative gain measurement around the two loops. A gain control system 209 takes as input signals 212 and 211 the outputs of auxiliary feedback loop 208 and Cartesian feedback loop 207, respectively. Gain control system 209 adjusts a gain (e.g., gain $K_2$ of amplifier 202) to equalize the two feedback loop outputs. Gain control system 209 endeavors to maintain the equality expressed above to enable open- and closed-loop operating modes in system 200 without disrupting either the loop gain or the total gain when transitioning between modes.

An advantage of the use of gain control system 209 is that consistency between the open- and closed-loop operating modes can be maintained even if one or more of the gains of amplifiers 201–204 are not precisely known or are subject to manufacturing, temperature, or voltage variations. For example, the gains of RF amplifiers typically are less accurate than the gains of baseband amplifiers. Without gain control system 209, RF amplifier gain inaccuracies can cause the total gains in the open- and closed-loop modes of operation to differ because the required gain equalities are not always satisfied. With gain control system 209, however, the total gain can be made equal in both modes of operation.

In one implementation, gain control system 209 is not included in system 200. Gain control system 209 can be omitted, for example, if the gains of auxiliary feedback loop 208 and Cartesian feedback loop 207 are matched closely. If the gains of the two loops are matched closely enough, any change in gain when transitioning between the open- and closed-loop modes of operation will be small enough that a limit imposed by a standard with which system 200 is meant to comply will not be exceeded.

The total gain in each of the two modes of operation is given as follows:

Cartesian Feedback Loop Mode (closed loop):

$$G_{CFL} = \frac{K_1 K_2}{1 + K_1 K_2 F_2} \approx \frac{1}{F_2},$$

Auxiliary Feedback Loop Mode (open loop):

$$G_{AFL} = \frac{K_1 K_2}{1 + K_1 F_1} \approx \frac{K_2}{F_1},$$

where the approximations hold if each loop has a sufficiently large loop gain. In a feedback system, a large forward-path gain can be beneficial. In system 200, the gain element common to the forward paths of both loops is amplifier 201. As the above expressions indicate, when the gain of amplifier 201 ($K_1$) is sufficiently large, the gains in each mode of operation are, to first order, independent of $K_1$ itself. Without the auxiliary feedback path, the total gain of the open-loop mode would depend directly on the gain of amplifier 201. A total gain that depends directly on the gain of amplifier 201 might be undesirable if the gain of amplifier 201 is spectrally shaped to improve performance when the Cartesian feedback loop is closed. For example, amplifier 201 can have very high gain at very low frequencies, but only moderately high gain at higher frequencies. Without the use of auxiliary feedback loop 208, the spectral shaping of amplifier 201 would distort the output signal when the Cartesian feedback loop 207 is open. However, if the auxiliary feedback loop 208 is activated when the Cartesian feedback loop 207 is open, the total gain becomes largely independent of the gain of amplifier 201 in both modes, and the spectral shaping of the gain of amplifier 201 substantially does not distort the output signal.

Other implementations can use an auxiliary feedback loop with a different input connection, or can use a gain control system without an auxiliary feedback loop. For example, system 220 of FIG. 2B takes the auxiliary feedback path input from before 20 amplifier 221 (which is similar to amplifier 201 from FIG. 2A). In system 220, the gain relationship that can be satisfied for the total gains of the open- and closed-loop operating modes to be the same is $F_1 = K_1 K_2 F_2$.

Similar to system 200 of FIG. 2A, equality is maintained by a gain control system 229, which adjusts the gain of amplifier 222 until the gain controller input signals 231 and 232 have equal signal strength. In system 220, the gain of amplifier 224 is numerically equal to the loop gain of the Cartesian feedback loop 227. Thus, system 220 has the advantage that the loop gain of the Cartesian feedback loop 227 is explicitly set by amplifier 224.

An implementation that employs a gain control system without an auxiliary feedback loop is shown in FIG. 3. Because no auxiliary feedback loop is used, an amplifier 348 is provided at the input to a Cartesian feedback loop 347 to counteract the change in total gain that occurs when the Cartesian feedback loop 347 is opened. The total gain is the same in both the open- and closed-loop modes of operation when the following gain equality is satisfied:

$$K_3 = \frac{1}{1+K_1 K_2 F_2} = \frac{1}{1+F_1}.$$

A gain control system 349 causes the cascaded gain of amplifiers 341, 342, and 343 to equal the gain of an amplifier 344, thereby establishing a known loop gain for Cartesian feedback loop 347 that is equal to the gain of amplifier 344. Because amplifier 344 is a baseband amplifier, amplifier 344 can have a very accurate gain. Thus, the gain of Cartesian feedback loop 347 can also be made very accurate.

Opening Cartesian feedback loop 347 causes the gain of the Cartesian section (that is, the gain from the input of a summing junction 346 to the output of amplifier 342) to increase by a factor equal to $1+F_1$. To compensate for the gain increase when opening Cartesian feedback loop 347, amplifier 348, which has a gain of $1/(1+F_1)$, is inserted into the signal path. Therefore, Cartesian feedback loop 347 can be opened by switching selector 350 to 'b' (ground) and switching selector 345 to 'b,' as well. Selector 345 provides a means of selecting between open- and closed-loop operating modes for the Cartesian feedback loop 347. Other means of selecting between open- and closed-loop modes are also possible.

FIG. 4 shows an implementation of a Cartesian feedback loop transmitter 400. In transmitter 400, feedback amplifier 102 (FIG. 1) has been removed, and a Cartesian feedback loop can be opened at power levels where linearization is not necessary.

Transmitter 400 includes six major sections, each with in-phase and quadrature signal paths: an input path section 419, a forward path section 401, a modulator section 402, a main feedback path section 403, an auxiliary feedback path section 404, and a gain control system 405. The input path section 419 includes input amplifiers 420. The forward path section 401 includes gain amplifiers 406 for each of an in-phase and quadrature signal path, a complex signal rotator 407, which can provide a signal rotation in the complex plane, and loop filters 408, which compensate the feedback loop dynamics and provide noise filtering for transmitter 400. The use of the signal rotator 407 is one technique for avoiding net signal rotation around the feedback loop that includes main feedback path 403.

Forward path section 401 is coupled to a modulator section 402 that includes up-conversion mixers 409, variable-gain amplifier 410, and power amplifier 411. Variable-gain amplifier 410 provides a control point for gain control system 405 to adjust the gain of modulator section 402. Adjusting the gain of modulator section 402 corresponds to adjusting the gain of amplifier 202 in FIG. 2A. In one implementation, the adjustment of the gain of amplifier 410 in modulator section 402 provides a way to maintain the equality of the gains around the main and auxiliary loops. Other implementations are also possible where other amplifiers in the system are adjusted to maintain the desired equality.

The output of modulator 402 is coupled to the input of main feedback path 403 using a coupler 412. Main feedback path 403 includes a programmable RF attenuator 413 and down-conversion mixers 414. The input of modulator 402 is coupled to the input of auxiliary feedback path 404. Auxiliary feedback path 404 includes a second rotator 415 and buffers 416. Rotator 415 cancels the rotation introduced by rotator 407 in forward path 401 so that auxiliary feedback path 404 is stable when closed. Rotator 415 can be omitted in an implementation that does not include signal rotator 407. The signals labeled A–D are the output signals of the main and auxiliary feedback paths. In the implementation of FIG. 4, signals A–D are taken at the summing points of the feedback paths, referring to the fact that these points may be applied to summing junctions 422 of the transmitter, depending upon the mode of operation. Signals A–D are used by gain control system 405 to determine how gain of modulator 402 should be set to ensure that the loop gains are equalized. Other implementations are possible in which the signals employed by gain control system 405 are tapped from points in the two feedback paths that are not strictly at the summing points.

The outputs of main feedback path 403 and auxiliary feedback path 404 are connected to a pair of selectors, 421, which select which of the two feedback paths is connected to the summing junctions 422. When main feedback path 403 is selected, transmitter 400 is in closed-loop operating mode, and the Cartesian feedback action of the loop that includes forward path 401, modulator 402, and main feedback path 403 is activated. When auxiliary feedback path 404 is selected, transmitter 400 is in open-loop operating mode, and the Cartesian feedback action is de-activated. Similar to system 200 of FIG. 2A, the gain of the loop including auxiliary feedback path 404, the gain of the loop including main feedback path 403, and the closed loop gain of transmitter 400 will be consistent between the open-and closed-loop operating modes when the gain of auxiliary feedback path 404 is equal to the product of the gains of modulator 402, coupler 412, and main feedback path 403. Gain control system 405 maintains the equality by comparing the signal powers at the summing points of auxiliary feedback path 404 and main feedback path 403 and by adjusting the gain of the modulator 402 using variable gain amplifier 410 in response to any difference in the signal powers. Because modulator 402 and auxiliary feedback path 404 have a common input, equalizing the summing point signal powers is equivalent to equalizing the gains along each path. Comparing the signal powers at the summing points of the two feedback paths provides a way to determine the difference in gain between the feedback paths, but other signal measurements are also possible, such as measurements of signal voltages, currents, or envelopes.

While maintaining the equality of the loop gains of the open- and closed-loop operating modes is important, the absolute accuracy of the loop gains is also important. The absolute accuracy determines, in part, the stability margins of the transmitter 400. Because gain control system 405 adjusts the gain of modulator 402 in response to a gain error, the gain of the loop including auxiliary feedback path 404 serves as a fixed gain reference for the gain of the loop including main feedback path 403. Because the loop including auxiliary feedback path 404 includes only low-frequency baseband circuitry, the loop gain can be made equal to the ratio of certain passive components, thereby ensuring the accuracy of the loop gain. The loop including main feedback path 403 inherits the loop gain accuracy because the gain of the loop including main feedback path 403 is regulated to match the gain of the loop including auxiliary feedback path 404. Without such regulation, accurately determining the loop gain of the loop including main feedback path 403 can be difficult. The loop gain of the loop including main feedback path 403 involves several radio-frequency stages, the gains of which typically are less accurate because of the high operating frequency.

Transmitter 400 can use open- and closed-loop modes of operation even when gain amplifier 406 includes an integrator. Without the use of auxiliary feedback path 404, an integrating gain amplifier can be problematic in the open-loop mode because the integrating gain amplifier can saturate. By using auxiliary feedback path 404 in the open-loop mode, an integrator included in gain amplifier 406 can always be enclosed in a feedback loop, which prevents the integrating gain amplifier from saturating. An integrator in gain amplifier 406 is useful in transmitter 400 because the integrator helps reduce offsets and carrier leakage introduced in forward path 401.

Alternative implementations in which the input of auxiliary feedback path 404 is taken from different points in forward path 401 or modulator 402 are possible. In one alternative implementation, the input of an auxiliary feedback path is taken from a point in modulator 402 after up-conversion mixers 409. Down-conversion mixers are added to the auxiliary feedback path to convert the input signal of the auxiliary feedback path back to baseband frequencies. In another implementation, an auxiliary feedback path is tapped from a point preceding filters 408. In yet another implementation, the inputs for an auxiliary feedback path are tapped from a point preceding signal rotator 407, and rotator 415 is not included in the auxiliary feedback path.

Alternative implementations of transmitter 400 are also possible in which amplifier 102 is retained, but, for example, the performance requirements of amplifier 102 are relaxed because of the availability of an open-loop mode of operation. Such performance requirement relaxations can include a reduction in the required gain adjustment range or a relaxation of the required noise performance.

Referring to FIG. 4 and FIG. 5, one implementation of gain control system 405 includes two major sections: a detector section 510 and a gain controller section 511. Detector section 510 includes power detectors 502(1) and 502(2) and variable-gain amplifiers 501. The inputs to variable-gain amplifiers 501 are the in-phase and quadrature signals from main feedback path 403 and auxiliary feedback path 404. Power detectors 502(1) and 502(2) use both the in-phase and quadrature signals from the respective feedback path to detect the complex signal power in the path. Using both the in-phase and quadrature signal has the advantage that the power detection process is insensitive to rotational phase misalignment. In one implementation, only the in-phase signal or the quadrature signal is processed by detector section 510.

Variable-gain amplifiers 501 reduce the dynamic range of the signals to be processed by power detectors 502(1) and 502(2). Reducing the dynamic range of the signals is useful, though not strictly necessary, because power detectors with wide dynamic range can be more difficult to implement than power detectors with narrow dynamic range. Reducing the dynamic range of the signals is also useful for making the settling dynamics of the gain control system substantially independent of the signal level of signals A–D. If variable-gain amplifiers 501 have a gain range equal to or exceeding the dynamic range of signals A–D, then the level of the inputs to power detectors 502(1) and 502(2) can be maintained within a restricted range as the average input signal level varies. The gain settings of variable-gain amplifiers 501 need not be accurate, provided that the gains of the amplifiers processing auxiliary path signals A and B match those of the amplifiers processing main path signals C and D.

Power detectors 502(1) and 502(2) determine the average signal levels in the auxiliary feedback path 404 and main feedback path 403. For example, power detectors 502(1) and 502(2) can detect the complex signal power, voltage amplitude, or current amplitude of the detector input signals. In one implementation, power detectors 502(1) and 502(2) employ multipliers that calculate the mean-square value of the input signals. For example, by summing the mean-square value of the in-phase and quadrature signals of a complex signal, the vector signal power can be obtained. In another implementation, power detectors 502(1) and 502(2) perform an absolute value calculation on the input signals (e.g., by rectifying the input signals). The absolute value calculation also gives an indication of signal strength, which can be used to detect a difference in gains between the two feedback paths.

The outputs of power detectors 502(1) and 502(2) are applied to a summing junction 503 that computes a gain error signal 520 proportional to the difference in signal levels between the two feedback paths. Gain controller section 511 processes gain error signal 520 to determine how to adjust the gain of modulator 402. Gain error signal 520 is digitized by digitizer 504 and filtered by filter 505. The resulting gain estimate signal 524 is qualified by qualifier 506 to impose explicit limits on the deviations of the gain setting of modulator 402. The operation of qualifier 506 and the motivation for using qualifier 506 are described in more detail in subsequent paragraphs. The qualified gain estimate 528 is decoded to control the gain of modulator 402. In analog implementations of gain control system 405, digitizer 504 and decoder 508 can be omitted. In one implementation, qualifier 506 is omitted. In another implementation, filters are included between power detectors 502(1) and 502(2) and summing junction 503. The filters can be used instead of filter 505 or along with filter 505.

Gain control system 405 has a finite response time because filter 505 has a finite bandwidth. When executing a step change in the system output power in closed-loop mode (which can involve a change in the gain of the main feedback path 403), the Cartesian feedback loop can momentarily oscillate until the gain control system 405 can respond. Oscillation can occur if a change in the gain of the main feedback path 403 causes the loop gain of the Cartesian feedback loop to exceed a gain margin for stable operation. To avoid oscillation, gain controller 511 includes a gain step element 507 that provides an immediate increment in the gain estimate corresponding to any step change in the gain of the main feedback path 403. The immediate increment does not need to be an accurate increment. The immediate increment adjusts the gain of modulator 402 so that a gain margin of the loop including main feedback path 403 is not exceeded immediately after a gain step. Once gain control system 405 has time to respond to the new loop conditions created by a gain step, the gain of modulator 402 will settle to an optimal value (i.e., to within the accuracy limits of gain control system 405).

In open-loop mode, the Cartesian feedback loop does not oscillate in the manner described above. However, the finite response time of the gain control system 405 remains. Therefore, it is useful to use the gain step element 507 in open-loop mode to reduce a magnitude of settling required of the gain control system, thereby reducing the settling time. Reducing the settling time can be useful, for example, in systems that limit the maximum settling time for an output power step.

Some wireless systems impose strict limits on output power transients produced by transmitters when output power levels are adjusted. Noise in gain estimate signal 524 can produce noisy fluctuations in the gain setting of modulator 402, causing transmitter 400 to exceed the output power transient limits. When a gain step is executed while transitioning from closed-loop operation to open-loop operation, the accuracy of the gain step can be limited by how well the gains of the loop including main feedback path 403 and the loop including auxiliary feedback path 404 match. Dithering of the gain of modulator 402 in the open-loop mode reduces the available budget for gain mismatch, making the power transient requirement more difficult to meet. A gain step executed while transitioning from open-loop operation to closed-loop operation is not as critical because the effect of dithering the gain of modulator 402 in the closed-loop mode has a reduced influence on the output power due to the gain of the loop including the main feedback path 403.

Qualifier 506 can be used in gain control system 405 to help transmitter 400 remain within limitations on output power transients. Qualifier 506 qualifies gain estimate signal 524 according to the power transient limits associated with a given step in output power. In one implementation, when transmitter 400 is operating at a low signal-to-noise ratio, an explicit limit is placed on the allowable changes of the gain of modulator 402 to prevent the output power from exceeding imposed limits. In another implementation, adjusting the gain of modulator 402 can be disallowed entirely (apart from the immediate adjustment provided by gain step element 507) when the transmitter 400 transitions from closed-loop to open-loop operation. By not adjusting the gain of modulator 402, dithering is eliminated, and the gain error budget is maximized. Gain adjustments can be allowed when transitioning from open-loop to closed-loop mode, because gain dithering in closed-loop mode is less problematic.

Qualifier 506 can impose explicit restrictions on gain estimate signal 524. In one implementation, if gain estimate signal 524 qualifies for the current output power and/or most recent power step size, the gain estimate signal 524 is passed to decoder 508 unmodified by qualifier 506. If gain estimate signal 524 does not qualify for the current output power and/or most recent power step size, the qualifier 506 does not pass gain estimate signal 524 and instead retains the last qualifying value of gain estimate signal 524.

When gain estimate signal 524 is disqualified, gain controller 511 can reset filter 505 to begin the process of developing a new gain estimate.

The implementation of gain control system 405 shown in FIG. 5 incorporates useful features that provide enhanced performance, but simpler implementations of gain control system 405 are also possible. In one implementation, variable-gain amplifiers 501, digitizer 504, qualifier 506, gain step element 507 and decoder 508 are omitted, and gain controller 511 is an analog gain controller. Gain step element 507 can be included and have a voltage or a current as an output. In one digital implementation, variable-gain amplifiers 501, qualifier 506 and gain step element 507 are omitted.

FIG. 6 shows a flowchart of a gain control method 600. When a change in output power is required, a gain estimate is immediately incremented to approximately implement the desired gain step (step 605). Step 605 can be performed, for example, by gain step element 507 in FIG. 5. Subsequent steps in method 600 can be performed by gain control system 405 in FIG. 4. The output power of a main feedback path is determined (step 610), as is the output power of an auxiliary feedback path (step 615). The output powers are subtracted to form an error estimate (step 620), and the error estimate is filtered to form an estimate of the required gain change (step 625). The estimate of the required gain change is compared to zero or a small threshold (step 630). If the gain change estimate is substantially zero (e.g., below a small threshold), method 600 has converged to an acceptable gain setting.

If the estimated gain change is not substantially zero, the gain change estimate is further qualified (step 635) according to rules established for the current output power setting and/or output power step. If the gain change estimate qualifies, then the gain is updated (step 640) and method 600 returns to step 610. Otherwise, the gain is not updated and the filter is reset (step 645) before returning to step 610. In one implementation, steps 635 and 645 are omitted if qualification is unnecessary to meet performance objectives. Method 600 can proceed directly from step 630 to step 640.

Once method 600 has converged to an acceptable gain setting, method 600 can continue to execute to control the gain in the presence of drift, or method 600 can be paused (and gain controller circuitry executing method 600 can be powered down to save power). Alternatively, method 600 can be run for a specified time duration, after which the error is guaranteed by design to have converged to within an acceptable error tolerance.

Referring to FIG. 4 and FIG. 6, gain controller circuitry executing method 600 (e.g., gain control system 405) can be powered down in either the open-loop mode of operation or the closed-loop mode. In the open-loop mode, a further power savings can be obtained by powering down the main feedback path (e.g., main feedback path 403) of the Cartesian loop when the gain controller circuitry is not in use. Similarly, in the closed-loop mode, a further power savings can be obtained by powering down the auxiliary feedback path (e.g., auxiliary feedback path 404) when the gain controller is not in use.

The invention and all of the functional operations described in this specification can be implemented in electronic circuitry, or in computer hardware, firmware, software, or in combinations of them.

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit).

The invention has been described in terms of particular embodiments. Other embodiments are within the scope of the following claims.

What is claimed is:
1. A circuit comprising:
   a signal combiner operable to receive an input signal and a feedback signal and produce a combined signal at an output of the signal combiner;
   a selector operable to provide the feedback signal to the signal combiner;
   a power amplifier, the output of the signal combiner coupled to an input of the power amplifier;
   a first feedback path operable to couple an output of the power amplifier to a first input of the selector; and a second feedback path operable to couple the input of the power amplifier to a second input of the selector.

2. The circuit of claim 1, wherein the power amplifier includes an adjustable amplifier, an input of the adjustable amplifier is coupled to the output of the signal combiner and an output of the adjustable amplifier is coupled to the input of the power amplifier, the circuit further comprising:
a controller coupled to a node in the first feedback path and coupled to a node in the second feedback path, the controller operable to adjust a gain of the adjustable amplifier.

3. The circuit of claim 2, wherein the controller adjusts the gain of the adjustable amplifier until a gain of a loop including the first feedback path and a gain of a loop including the second feedback path are substantially equal.

4. The circuit of claim 2, wherein the controller includes a qualifier operable to modify the adjustment of the gain of the adjustable amplifier based on a set of rules limiting allowable adjustments.

5. The circuit of claim 2, wherein the controller includes a gain step element operable to adjust the gain of the adjustable amplifier in conjunction with a change in an output power of the circuit.

6. The circuit of claim 2, wherein the controller includes:
a first power detector operable to measure a power of the first feedback path and produce a first power signal;
a second power detector operable to measure a power of the second feedback path and produce a second power signal; and
a combiner operable to receive the first power signal and the second power signal and produce an error signal.

7. The circuit of claim 6, wherein the controller includes a filter operable to receive the error signal and produce a filtered signal, the controller adjusting the gain of the adjustable amplifier using the filtered signal.

8. The circuit of claim 6, wherein the controller includes:
a first variable-gain amplifier coupled to an input of the first power detector; and
a second variable-gain amplifier coupled to an input of the second power detector.

9. The circuit of claim 6, wherein:
the first power detector includes a first multiplier operable to calculate a mean-square value of the power of the first feedback path; and
the second power detector includes a second multiplier operable to calculate a mean-square value of the power of the second feedback path.

10. The circuit of claim 6, wherein:
the first power detector includes a first rectifier operable to calculate an absolute value of the power of the first feedback path; and
the second power detector includes a second rectifier operable to calculate an absolute value of the power of the second feedback path.

11. The circuit of claim 6, wherein the controller includes a digitizer operable to receive the error signal and produce a digital error signal.

12. The circuit of claim 1, further comprising:
an integrating gain amplifier coupled to the output of the signal combiner and coupled to the input of the power amplifier.

13. The circuit of claim 1, wherein the first feedback path includes in-phase and quadrature first feedback paths and the second feedback path includes in-phase and quadrature second feedback paths.

14. The circuit of claim 1, wherein the second feedback path includes a rotator.

15. The circuit of claim 1, wherein at least one of the first feedback path and the second feedback path includes a variable-gain element.

16. The circuit of claim 1, further comprising:
a first amplifier coupled to the input of the power amplifier, wherein the first feedback path includes a second amplifier, and the second feedback path includes a third amplifier.

17. A circuit comprising:
a forward path including an adjustable amplifier;
a first selector having at least two inputs and an output, the output of the first selector coupled to an input of the forward path;
a feedback path coupling an output of the forward path to an input of the first selector; and
a controller operable to measure a signal at a node in the feedback path, to measure a signal at a node in the forward path before the adjustable amplifier, and to adjust a gain of the adjustable amplifier responsive to the measurements, the gain being adjusted substantially concurrently with amplification of a transmit signal by the adjustable amplifier.

18. The circuit of claim 17, further comprising:
a second selector having at least two inputs and an output, the output of the second selector coupled to the input of the forward path; and
a first amplifier coupled to a first input of the second selector, an input of the first amplifier coupled to an input of the circuit, a second input of the second selector coupled to the input of the circuit.

19. The circuit of claim 18, wherein:
the forward path includes a second amplifier and a power amplifier;
the feedback path includes a third amplifier; and
the outputs of the first and second selectors are coupled to the input of the forward path through a signal combiner.

20. The circuit of claim 17, further comprising:
a controller amplifier coupling the controller to the node in the forward path where the controller measures the signal, wherein the controller adjusts the gain of the adjustable amplifier until a gain of a loop including the feedback path and a gain of the controller amplifier are substantially equal.

21. The circuit of claim 20, wherein the controller includes:
a first power detector operable to measure a power of the feedback path and produce a first power signal;
a second power detector operable to measure a power at an output of the controller amplifier and produce a second power signal; and
a combiner operable to receive the first power signal and the second power signal and produce an error signal.

22. The circuit of claim 21, wherein the controller includes a filter operable to receive the error signal and produce a filtered signal, the controller adjusting the gain of the adjustable amplifier using the filtered signal.

23. The circuit of claim 21, wherein the controller includes:
a first variable-gain amplifier coupled to an input of the first power detector; and
a second variable-gain amplifier coupled to an input of the second power detector.

24. The circuit of claim 21, wherein:
the first power detector includes a first multiplier operable to calculate a mean-square value of the power of the feedback path; and the second power detector includes a second multiplier operable to calculate a mean-square value of the power at the output of the controller amplifier.

25. The circuit of claim 21, wherein:
the first power detector includes a first rectifier operable to calculate an absolute value of
the power of the feedback path; and
the second power detector includes a second rectifier operable to calculate an absolute value of the power at the output of the controller amplifier.

26. The circuit of claim 21, wherein the controller includes a digitizer operable to receive the error signal and produce a digital error signal.

27. The circuit of claim 17, wherein the controller includes a qualifier operable to modify the adjustment of the gain of the adjustable amplifier based on a set of rules limiting allowable adjustments.

28. The circuit of claim 17, wherein the controller includes a gain step element operable to adjust the gain of the adjustable amplifier in conjunction with a change in an output power of the circuit.

29. A method comprising:
measuring a first power of a first feedback path associated with a transmitter;
measuring a second power of a second feedback path associated with the transmitter;
calculating a difference between the first power and the second power; and
adjusting a gain of an amplifier associated with the transmitter responsive to the difference until the first power and the second power are substantially equal.

30. The method of claim 29, further comprising:
decoupling the first feedback path from an input of a forward path; and
coupling the second feedback path to the input of the forward path, the decoupling and the coupling occurring substantially simultaneously.

31. The method of claim 30, wherein the first feedback path is decoupled when a power of the transmitter falls below a threshold.

32. The method of claim 29, further comprising:
filtering the difference to form a gain estimate, wherein adjusting the gain responsive to the difference includes using the gain estimate to adjust the gain.

33. The method of claim 32, further comprising:
disqualifying a change in the gain estimate to limit a change in an output power.

34. The method of claim 33, further comprising:
restarting the filtering of the difference when the change in the gain estimate is disqualified, the restarting of the filtering serving to reset the gain estimate.

35. The method of claim 29, further comprising:
applying a step to the gain responsive to a change in a gain of the first feedback path, the second feedback path, or both.

36. The circuit of claim 1, wherein the selector is directly coupled to the signal combiner.

* * * * *